United States Patent
Lim et al.

(10) Patent No.: US 10,923,168 B2
(45) Date of Patent: Feb. 16, 2021

(54) METHOD OF MAKING MAGNETIC TUNNEL JUNCTION MEMORY DEVICE WITH STRESS INDUCING LAYERS

(71) Applicant: SK hynix Inc., Icheon-si (KR)

(72) Inventors: Jong-Koo Lim, Icheon-si (KR);
Ku-Youl Jung, Seoul (KR);
Jae-Hyoung Lee, Icheon-si (KR);
Jeong-Myeong Kim, Hwaseong-si (KR); Tae-Young Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/794,000

(22) Filed: Feb. 18, 2020

(65) Prior Publication Data

US 2020/0185017 A1 Jun. 11, 2020

Related U.S. Application Data

(63) Continuation of application No. 16/055,695, filed on Aug. 6, 2018, now Pat. No. 10,566,041.

(30) Foreign Application Priority Data

Sep. 7, 2017 (KR) .................. 10-2017-0114543

(51) Int. Cl.
*G11C 11/16* (2006.01)
*H01L 43/08* (2006.01)
(Continued)

(52) U.S. Cl.
CPC ........ *G11C 11/161* (2013.01); *H01L 27/1222* (2013.01); *H01L 27/222* (2013.01);
(Continued)

(58) Field of Classification Search
CPC .................................................. G11C 11/161
(Continued)

(56) References Cited

U.S. PATENT DOCUMENTS

| 8,089,112 B2 | 1/2012 | Murata et al. |
| 8,704,320 B2 | 4/2014 | Zhu et al. |

(Continued)

OTHER PUBLICATIONS

Non-Final Office Action dated Jun. 27, 2019 in U.S. Appl. No. 16/055,695, for Lim et al., filed Aug. 6, 2018, 21 pages.

(Continued)

*Primary Examiner* — Ajay Arora
(74) *Attorney, Agent, or Firm* — Perkins Coie LLP

(57) ABSTRACT

An electronic device may include a semiconductor memory, and the semiconductor memory may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element.

15 Claims, 12 Drawing Sheets

(51) Int. Cl.
  *H01L 27/22*  (2006.01)
  *H01L 43/02*  (2006.01)
  *H01L 43/12*  (2006.01)
  *H01L 43/10*  (2006.01)
  *H01L 27/12*  (2006.01)
(52) U.S. Cl.
  CPC .............. *H01L 43/02* (2013.01); *H01L 43/08* (2013.01); *H01L 43/10* (2013.01); *H01L 43/12* (2013.01)
(58) Field of Classification Search
  USPC .......................................................... 438/48
  See application file for complete search history.

(56) References Cited

U.S. PATENT DOCUMENTS

| 9,000,545 | B2 | 4/2015 | Kajiyama | |
|---|---|---|---|---|
| 2012/0217594 | A1* | 8/2012 | Kajiyama | G11C 11/161 |
| | | | | 257/421 |
| 2016/0005953 | A1* | 1/2016 | Lee | H01L 43/08 |
| | | | | 711/126 |

OTHER PUBLICATIONS

Notice of Allowance dated Oct. 8, 2019 in U.S. Appl. No. 16/055,695, for Lim et al., filed Aug. 6, 2018, 21 pages.

* cited by examiner

METHOD OF MAKING MAGNETIC TUNNEL JUNCTION MEMORY DEVICE WITH STRESS INDUCING LAYERS

CROSS-REFERENCE TO RELATED APPLICATION

This patent document is a continuation of U.S. patent application Ser. No. 16/055,695, entitled "ELECTRONIC DEVICE AND METHOD FOR FABRICATING THE SAME" and filed on Aug. 6, 2018, which claims priority of Korean Patent Application No. 10-2017-0114543, entitled "ELECTRONIC DEVICE AND METHOD FOR FABRICATING THE SAME" and filed on Sep. 7, 2017. The entire disclosure of U.S. patent application Ser. No. 16/055,695 and Korean Patent Application No. 10-2017-0114543 is incorporated herein by reference as part of this patent document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element that exhibits different resistance states for storing data.

In one aspect, an electronic device may include a semiconductor memory, and the semiconductor memory may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element.

Implementations of the above electronic device may include one or more the following.
The first protective layer may apply a compressive stress to at least a part of the variable resistance element. The first protective layer may apply a compressive stress to the free layer. The second protective layer may apply a tensile stress to at least a part of the variable resistance element. The second protective layer may apply a tensile stress to the pinned layer. Each of the first protective layer and the second protective layer may include a material capable of applying any one of a compressive stress or a tensile stress to at least a part of the variable resistance element. Each of the first protective layer and the second protective layer may include a passivation layer including an oxide, a nitride, or hydrogen, or a combination thereof.

In another aspect, an electronic device may include a semiconductor memory, wherein the semiconductor memory may include: a first magnetic layer disposed over a substrate; a tunnel barrier layer disposed over the first magnetic layer; a first capping layer disposed over the tunnel barrier layer; a second magnetic layer disposed over the first capping layer; a pinning layer disposed over the second magnetic layer; a first protective layer disposed on a sidewall of the first magnetic layer, a sidewall of the tunnel barrier layer and a sidewall of the first capping layer; and a second protective layer disposed on a sidewall of the second magnetic layer and a sidewall of the pinning layer, wherein the first protective layer may include a material to provide a compressive stress to the first magnetic layer, and the second protective layer may include a material to provide a tensile stress to the second magnetic layer.

Implementations of the above electronic device may include one or more the following.
Each of the first protective layer and the second protective layer may include a passivation layer including an oxide, a nitride, or hydrogen, or a combination thereof. The second protective layer may apply a tensile stress to the pinning layer. The first magnetic layer, the tunnel barrier layer, the first capping layer, the second magnetic layer and the pinning layer may have sidewalls aligned with each other.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In further another aspect, a method for fabricating an electronic device may include forming a first portion of a variable resistance element over a substrate; forming a first protective layer on a sidewall of the first portion of the variable resistance element by performing a first passivation process; forming a second portion of the variable resistance element over the first portion; and forming a second protective layer on a sidewall of the second portion of the variable resistance element by performing a second passivation process, wherein any one layer of the first protective layer and the second protective layer may apply a compressive stress to the variable resistance element, and the other layer may apply a tensile stress to the variable resistance element.

Implementations of the above method may include one or more the following.

The first protective layer may apply a compressive stress to at least a part of the variable resistance element. The first portion of the variable resistance element may include a free layer having a variable magnetization direction, and the first protective layer may apply a compressive stress to the free layer. The second protective layer may apply a tensile stress to at least a part of the variable resistance element. The second portion of the variable resistance element may include a pinned layer having a fixed magnetization direction, and the second protective layer may apply a tensile stress to the pinned layer. Each of the first passivation process and the second passivation process is performed by using a material capable of applying any one of a compressive stress and a tensile stress to at least a part of the variable resistance element. The material may include an oxide, a nitride, or hydrogen, or a combination thereof. The first portion and the second portion may have sidewalls aligned with each other. The first portion of the variable resistance element may include: a free layer having a variable magnetization direction; a tunnel barrier layer formed over the free layer; and a first capping layer formed over the tunnel barrier layer, wherein the second portion of the variable resistance element may include: a pinned layer having a fixed magnetization direction; and a pinning layer formed over the pinned layer, wherein the first protective layer may apply a compressive stress to the free layer, and the second protective layer may apply to a tensile stress to the pinned layer and the pinning layer.

These and other aspects, implementations and associated advantages are described in greater detail in the drawings, the description and the claims.

DETAILED DESCRIPTION

Figure 1A:
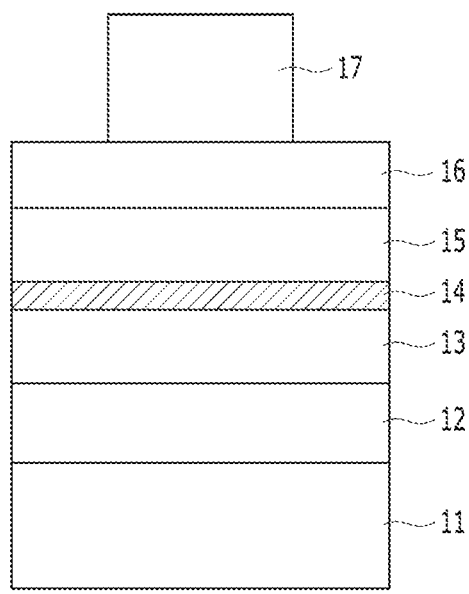
FIGS. 1A to 1C are cross-sectional views illustrating a semiconductor memory and a method for fabricating the same in accordance with one example where a variable resistance element 10 is formed to have a pillar shape having a tilted profile rather than a vertical profile.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

Prior to explaining implementations of the present disclosure, a semiconductor memory in accordance with a comparative example will be explained.

Figure 1B:
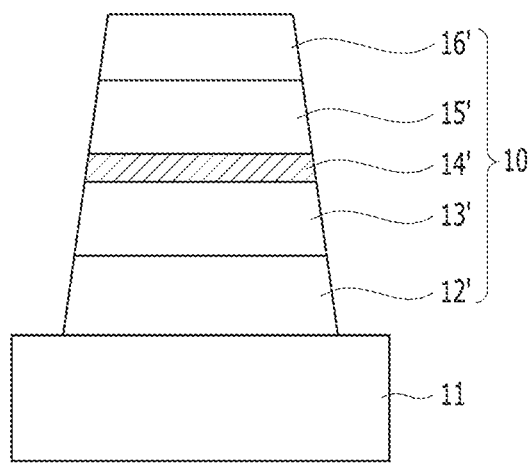
Figure 1C:
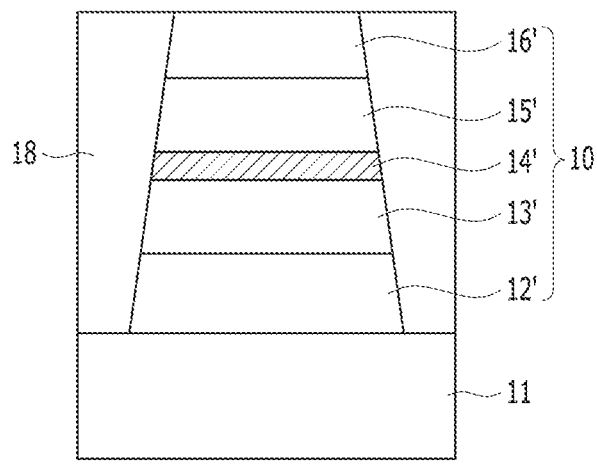

FIGS. 1A to 1C are cross-sectional views illustrating a semiconductor memory and a method for fabricating the same in accordance with one example where a variable resistance element 10 is formed to have a pillar shape having a tilted profile rather than a vertical profile.

Referring to FIG. 1A, a material layer 12 for an under layer may be formed over a substrate 11 where a predetermined structure (not shown) is formed.

A material layer 13 for a free layer, a material layer 14 for a tunnel barrier layer and a material layer 15 for a pinned layer may be sequentially formed over the material layer 12 for the under layer.

A material layer 16 for an upper layer may be formed over the material layer 15 for the pinned layer.

A hard mask pattern 17 may be formed over the material layer 16 for the upper layer. The hard mask pattern 17 may be formed by forming a material layer for the hard mask pattern 17 and a photoresist pattern (not shown) over the material layer 16 for the upper layer and etching the material layer for the hard mask pattern 17 using the photoresist pattern as an etch barrier.

The material layer 16 for the upper layer, the material layer 15 for the pinned layer, the material layer 14 for the tunnel barrier layer, the material layer 13 for the free layer and the material layer 12 for the under layer may be sequentially etched by using the hard mask pattern 17 as an etch barrier.

The etch process may be performed by using a suitable etching technique such as an ion beam etch (IBE) process or a reactive ion etch (RIE) process. In accordance with the exemplary fabrication method as shown in FIGS. 1A to 1C, when forming a variable resistance element (see the reference numeral 10 of FIG. 1B), all layers forming the variable resistance element 10 are deposited before starting the etch process and then the deposited layers are simultaneously etched by a single etch process. However, since the layers to be etched, that is, the material layer 16 for the upper layer, the material layer 15 for the pinned layer, the material layer 14 for the tunnel barrier layer, the material layer 13 for the free layer and the material layer 12 for the under layer have different etch rates from one another due to different thicknesses and materials, the variable resistance element 10 obtained after the etch process has an oblique sidewall instead of a vertical sidewall that is perpendicular to the surface of any layer of the variable resistance element 10.

Referring to FIG. 1B, after the etch process, the variable resistance element 10 may be provided to include an under layer 12', a free layer 13', a tunnel barrier layer 14', a pinned layer 15' and an upper layer 16'. The free layer 13', the tunnel barrier layer 14' and the pinned layer 15' may form a magnetic tunnel junction (MID structure. As described above, the variable resistance element 10 may be formed to have a sidewall which forms an oblique angle to the surface of the layers of the variable resistance element 10. The sidewall of the variable resistance element 10 is disposed at an angle that is not perpendicular with respect to the surface of any layer of the variable resistance element 10. In some implementations, the variable resistance element 10 has a trapezoid shape having an inclined profile.

Referring to FIG. 1C, a passivation layer 18 may be formed on a sidewall of the variable resistance element 10 by performing a passivation process and a surface cleaning process to the variable resistance element 10.

In accordance with the variable resistance element 10 obtained through the fabrication method as shown in FIGS. 1A to 1C, the variable resistance element 10 is formed to have a sidewall forming a non-perpendicular angle with respect to the surface of any layer of the variable resistance element 10. In some implementations, the sidewall of the variable resistance element may have a tilted profile rather than a vertical profile. With the non-perpendicular profile of the sidewall, magnetic characteristics of the free layer 13' and the pinned layer 15' may be deteriorated and thus, an electrical characteristic of the variable resistance element 10 may be deteriorated.

Moreover, in accordance with the variable resistance element 10 obtained through the fabrication method as shown in FIGS. 1A to 1C, since all layers forming the variable resistance element 10 are etched at one time through the single etch process, an etch time for forming the variable resistance element 10 can be increased to be sufficiently long to etch all the layers. If the etch time increases, an undesired deposition of etch byproducts may occur as the etch process proceeds. For example, when the etch process proceeds from the top, the top layer is etched first and the byproducts of the top layer may deposit again during a remaining etch process. In some implementations, the etch byproducts resulting from a portion of an etch target may be redeposited on the etched surface. For example, the etch byproducts may be redeposited on a sidewall of the variable resistance element 10 after pattering the variable resistance element 10. For example, metals included in the under layer 12' or other byproducts may be redeposited on a sidewall of the free layer 13' or the tunnel barrier layer 14' to cause leakage current, thereby deteriorating characteristics of the variable resistance element 10.

In accordance with an implementation of the disclosed technology, a semiconductor memory and its fabricating method are provided to include a variable resistance element with an improved characteristic. In some implementations, the disclosed technology provides the semiconductor memory which can control a stress applied to a layer of the variable resistance element. By controlling the stress applied to the layer, it is possible to improve a magnetic characteristic of a desired layer of the variable resistance element. In some implementations, the disclosed technology provides the semiconductor memory where different stresses are applied to the layers forming the variable resistance element. In some implementations, the disclosed technology provides the semiconductor memory including the variable resistance element having a substantially vertical.

Figure 2:
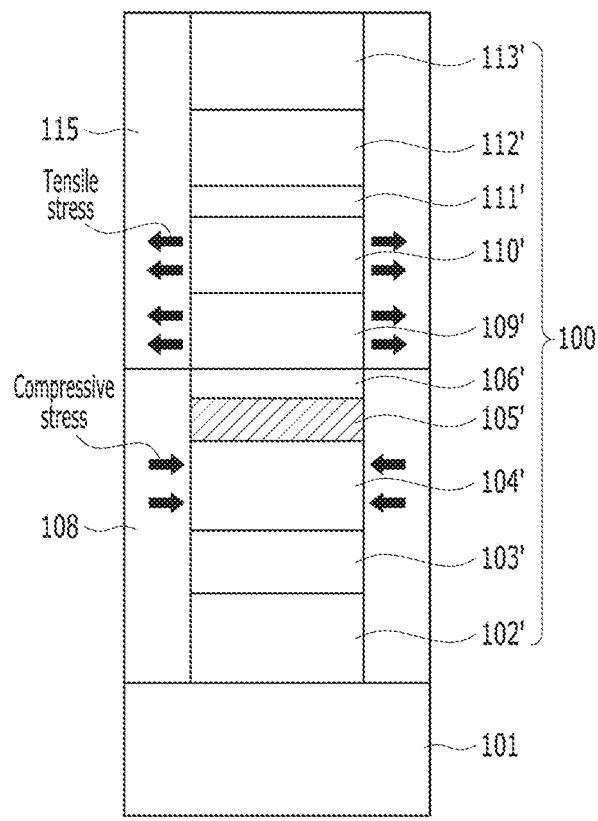
FIG. 2 is a cross-sectional view illustrating an exemplary semiconductor memory of the disclosed technology.

FIG. 2 is a cross-sectional views illustrating an exemplary semiconductor memory in accordance with an implementation of the present disclosure.

Referring to FIG. 2, a semiconductor memory in accordance with an implementation of the disclosed technology may include variable resistance element 100 disposed over a substrate 101, a first protective layer 108 disposed on a lower sidewall of the variable resistance element 100 and a second protective layer 115 disposed on an upper sidewall of the variable resistance element 100. In some implementations, the first protective layer 108 and the second protective layer 115 are structured to cover an entire sidewall of the variable resistance element 100. Some implementations of the disclosed technology provide the semiconductor memory as shown in FIG. 2 through the fabrication processes including two-step etch processes as will be discussed with FIGS. 3A to 3H.

The variable resistance element 100 may include a free layer 104', a pinned layer 109' and a tunnel barrier layer 105'. The free layer 104', the pinned layer 109' and the tunnel barrier layer 105' collectively form part of a Magnetic Tunnel Junction (MTJ) structure in which the free layer 104' is structured to exhibit a variable magnetization direction that can be changed to produce different magnetization states for the MTJ structure, the pinned layer 109' is structured to exhibit a fixed magnetization direction (which may also be referred to as a reference layer) and the tunnel barrier layer 105' is interposed between the free layer 104' and the pinned layer 109' to allow the tunneling of electrons in both data reading and data writing operations.

The free layer 104' may have a variable magnetization direction that changes between different directions to cause the MTJ structure to have a variable resistance value. With the change of the magnetization direction of the free layer 104', the relative relationship of the magnetization directions of the free layer 104' and the pinned layer 109' also changes, which allows the variable resistance element 100 to store different data or represent different data bits. The free layer 104' may also be referred as a storage layer or the like. The magnetization direction of the free layer 104' may be substantially perpendicular to a surface of the free layer 104', the tunnel barrier layer 105' and the pinned layer 109'. In other words, the magnetization direction of the free layer 104' may be substantially parallel to stacking directions of the free layer 104', the tunnel barrier layer 105' and the pinned layer 109'. Therefore, the magnetization direction of the free layer 104' may be changed between a downward direction and an upward direction. The change in the magnetization direction of the free layer 104' may be induced by spin transfer torque.

The free layer 104' may have a single-layer or multilayer structure including a ferromagnetic material. For example, the free layer 104' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 105' may allow the tunneling of electrons in both data reading and data writing operations. In a write operation for storing new data, a high write current may be directed through the tunnel barrier layer 105' to change the magnetization direction of the free layer 104' and thus to change the resistance state of the MTJ for writing a new data bit. In a reading operation, a low reading current may be directed through the tunnel barrier layer 105' without changing the magnetization direction of the free layer 104' to measure the existing resistance state of the MTJ under the existing magnetization direction of the free layer 104' to read the stored data bit in the MTJ. The tunnel barrier layer 105' may include a dielectric oxide, for example, an oxide such as MgO, CaO, SrO, TiO, VO, or NbO or others.

The pinned layer 109' may have a fixed magnetization direction which contrasts with the magnetization direction of the free layer 104', and may be referred to as a reference layer or the like. In some implementations, the magnetization direction of the pinned layer 109' may be pinned in a downward direction. In some implementations, the magnetization direction of the pinned layer 109' may be pinned in an upward direction.

The pinned layer 109' may have a single-layer or multi-layer structure including a ferromagnetic material. For example, the pinned layer 109' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

If a voltage or current is applied to the variable resistance element 100, the magnetization direction of the free layer 104' may be changed by spin torque transfer. When the magnetization directions of the free layer 104' and the pinned layer 109' are parallel to each other, the variable resistance element 100 may be in a low resistance state to store a particular designated digital data bit such as '0'. Conversely, when the magnetization directions of the free layer 104' and the pinned layer 109' are anti-parallel to each other, the variable resistance element 100 may be in a high resistance state to store a different designated digital data bit such as '1'. In some implementations, the variable resistance element 100 can be configured to store data bit '1' when the magnetization directions of the free layer 104' and the pinned layer 109' are parallel to each other and to store data hit '0' when the magnetization directions of the free layer 104' and the pinned layer 109' are anti-parallel to each other.

In some implementations, the variable resistance element 100 may further include one or more layers performing various functions to improve a characteristic of the MTJ structure. For example, the variable resistance element 100 may further include a butter layer 102', an under layer 103', a first capping 106', a pinning layer 110', a spacer layer 111', a magnetic correction layer 112' and a second capping layer 113'.

The buffer layer 102' may be disposed under the under layer 103' and aid in crystal growth of the under layer 103'. When the buffer layer 102' is formed under the under layer 103', it is possible to aid in crystal growth of the under layer 103' and thus improve perpendicular magnetic crystalline anisotropy of the free layer 104'. The buffer layer 102' may have a single-layer or multilayer structure including a metal, a metal alloy, a metal nitride, or a metal oxide, or a combination thereof.

The under layer 103' may be disposed under the free layer 104' and serve to improve perpendicular magnetic crystalline anisotropy of the free layer 104'. The under layer 103' may have a single-layer or multi layer structure including a metal, a metal alloy, a metal nitride, or a metal oxide, or a combination thereof. The buffer layer 102' may be formed of a material having excellent compatibility with a lower electrode (not shown) in order to overcome a lattice constant mismatch between the lower electrode (not shown) and the under layer 103'. For example, the buffer layer 102' may include tantalum (Ta).

The first capping layer 106' may serve to protect layers disposed below the first capping layer 106' and function as a part of a hard mask in a first etch process of the two-step process for patterning the MTJ structure. The two-step process for pattering the MTJ structure, which include first and second etch processes, will be discussed in detail with reference to FIGS. 3A to 3H. The first capping layer 106' may have a single-layer or multilayer structure including a conductive material such as a metal, a metal nitride or others.

The pinning layer 110' may serve to fix a magnetization direction of the pinned layer 109' in one direction. The pinning layer 110' may include an antiferromagnetic material such as FeMn, IrMn, NiMn, or PtMn, or others.

The magnetic correction layer 112' may serve to offset or reduce an influence of a stray field generated by the pinned layer 109' so as to reduce a bias magnetic field in the free layer 104' due to the stray field of the pinned layer 109'. For this purpose, the magnetic correction layer 112' may have a magnetization direction opposite to that of the pinned layer 109'. For example, when the pinned layer 109' has a downward magnetization direction, the magnetic correction layer 112' may have an upward magnetization direction. When the pinned layer 109' has an upward magnetization direction, the magnetic correction layer 112' may have a downward magnetization direction. The magnetic correction layer 112' may have a single-layer or multilayer structure including a ferromagnetic material.

In this implementation, the magnetic correction layer 112' is located above the pinned layer 109', but the position of the magnetic correction layer 112' may be changed. For example, the magnetic correction layer 112' may also be located above, below, or next to the MTJ structure while it is patterned separately from the MTJ structure.

The spacer layer 111' may be interposed between the magnetic correction layer 112' and the pinned layer 109' and function as a buffer between the magnetic correction layer 112' and the pinned layer 109'. The spacer layer 111' may serve to improve characteristics of the magnetic correction layer 112'. The spacer layer 111' may include a noble metal such as ruthenium (Ru).

The second capping layer 113' may serve to protect layers disposed below the second capping layer 113' and function as a part of a hard mask in a second etch process during a two-step process for patterning the MTJ structure. Further, the second capping layer 113' may be disposed at a top of the variable resistance element 100 and function as an upper electrode of the variable resistance element 100. The second capping layer 113' may have a single-layer or multilayer structure including a conductive material such as a metal or others. In some implementations, the second capping layer 113' may include a metallic material having almost none or a small number of pin holes and high resistance to wet and/or dry etching. For example, the second capping layer 113' may include a noble metal such as ruthenium (Ru).

In the variable resistance element 100 in accordance with the above implementation, the free layer 104' is formed below the pinned layer 109'. Other implementations are also possible such that the free layer 104' can be formed above the pinned layer 109'.

In the implementation as shown in FIG. 2, the variable resistance element 100, which are formed through the two-step process, has a substantially vertical profile as compared to the memory device fabricated through the method shown in FIGS. 1A to 1C. The sidewall of the variable resistance element 100 is substantially perpendicular to the surface of any one of the layers of the variable resistance element 100. The right angle formed between the sidewall of the variable resistance element 100 and the surface of any layer of the variable resistance element 100 is distinguished from the oblique angle formed between the sidewall of the variable resistance element 10 and the surface of any layer of the variable resistance element 10 as shown in FIG. 1C. With the substantially perpendicular sidewall of the variable resistance element 100, it is possible to prevent volume deformation of magnetic layers such as the free layer 104' and the pinned layer 109', thereby improving magnetic characteristics of the magnetic layers. As a result, it is possible to prevent or minimize deterioration of electrical characteristics of the variable resistance element 100.

The semiconductor memory in accordance with the implementation of the disclosed technology may include the first protective layer 108 and the second protective layer 115, which are formed on a sidewall of the variable resistance element 100.

The first protective layer 108 and the second protective layer 115 can apply stresses in a direction perpendicular to a stacked direction of the layers included in the variable resistance element 100. The first protective layer 108 and the second protective layer 115 can apply stresses in different directions from each other. The first protective layer 108 and the second protective layer 115 are formed on different portions of the sidewalls of the variable resistance element 100. The first protective layer 108 and the second protective layer 115 are formed to surround different layers of the variable resistance element 100 and apply stresses to the different layers surrounded by the first protective layer 108 and the second protective layer 115. For example, one of the first protective layer 108 and the second protective layer 115 can apply a compressive stress and the other of the first protective layer 108 and the second protective layer 115 can apply a tensile stress. The first protective layer 108 and the second protective layer 115 may apply a desired stress to the layer(s) surrounded by the first protective layer 108 and the second protective layer 115. For example, the first protective layer 108 and the second protective layer 115 can apply a compressive stress or a tensile stress to improve a magnetic characteristic of a desired layer among the layers included in the variable resistance element 100.

The first protective layer 108 may be formed on a sidewall of a part of the variable resistance element 100. In some implementations, the first protective layer 108 may be formed on sidewalls of or including at least of the free layer 104' and the tunnel barrier layer 105'. In some implementations, the first protective layer 108 may be formed on sidewalls of or including at least of the free layer 104', the tunnel barrier layer 105' and the first capping layer 106'. In some implementations, the first protective layer 108 may be formed on sidewalls of or including at least of the buffer layer 102', the under layer 103', the free layer 104', the tunnel barrier layer 105' and the first capping layer 106'.

The first protective layer 108 may apply a compressive stress to a part of the variable resistance element 100, for example, the free layer 104'. The compressive stress applied to the free layer 104' by the first protective layer 108 may act in a direction to allow a lattice constant of the free layer 104' to be reduced, thereby improving magnetic characteristics of the free layer 104'. It is possible to increase crystallinity of the free layer 104' by applying the compressive stress to the free layer 104' to reduce the lattice constant of the free layer 104'. Since the characteristics of the free layer 104' may depends on the crystallinity, improved crystallinity can result in improved magnetic characteristics of the free layer 104'.

The first protective layer 108 may include a material capable of applying a compressive stress to at least a part of the variable resistance element 100. In some implementations, the first protective layer 108 may include an oxide layer, a nitride layer, or a hydrogen layer, or a combination thereof. In some implementations, the first protective layer 108 may be a passivation layer that is formed by a passivation process.

The second protective layer 115 may be formed on a side wall of at least a part of the variable resistance element 100. In some implementations, the second protective layer 115 may be formed on a sidewall of or including the pinned layer 109'. In some implementations, the second protective layer 115 may be formed on sidewalk of or including the pinned layer 109' and the pinning layer 110'. In some implementations, the second protective layer 115 may be formed on sidewalls of or including the pinned layer 109', the pinning layer 110', the spacer layer 111', the magnetic correction layer 112' and the second capping layer 113'.

The second protective layer 115 may apply a tensile stress to at least a part of the variable resistance element 100. For example, the second protective layer 115 may apply a tensile stress to the pinned layer 109'. For example, the second protective layer 115 may apply a tensile stress to the pinned layer 109' and the pinning layer 110'. The tensile stress applied to the pinned layer 109' and the pinning layer 110' may affect characteristics related to a shape anisotropy such as a perpendicular magnetic anisotropy, thereby improving characteristics of the variable resistance element 100.

The second protective layer 115 may include a material capable of applying a tensile stress to at least a part of the variable resistance element 100. In some implementations, the second protective layer 115 may include an oxide layer, a nitride layer, or a hydrogen layer, or a combination thereof. In some implementations, the second protective layer 115 may be a passivation layer that is formed by a passivation process.

As such, the first protective layer 108 may apply a compressive stress to the free layer 104', while the second protective layer 115 may apply a tensile stress to pinned layer 109' (or the pinned layer 109' and the pinning layer 110').

In the implementation, stresses can be applied to the layers included in the variable resistance element 100 by the first protective layer 108 and the second protective layer 115. The stresses applied to the layers of the variable resistance element 100 can be adjusted, for example, to have a desirable direction to improve a magnetic characteristic of the layers of the variable resistance element 100. Accordingly, magnetic characteristics of the variable resistance element 100 can be improved by applying different stresses to each of the free layer 104' and pinned layer 109' of the variable resistance element 100, not by changing each material forming the free layer 104' and pinned layer 109'.

In the semiconductor memory in accordance with the above implementation, the first protective layer 108 applies a compressive stress to a part of the variable resistance element 100 including the free layer 104', and the second protective layer 115 applies a tensile stress to a part of the variable resistance element 100 including the pinned layer 109' (or including the pinned layer 109' and the pinning layer 110'). Other implementations are also possible such that the first protective layer 108 and the second protective layer 115 can be designed to apply a stress, for example, a compressive stress or a tensile stress, to a different layer of the variable resistance element 100 to change or improve the properties of the different layer. Thus, the layers of the variable resistance element 100, to which the stresses are applied by the first protective layer 108 and the second protective layer 115, are not limited to the free layer 104, the pinned layer 109'.

On the other hand, in the variable resistance element 100 in accordance with this implementation, the free layer 104' is formed under the pinned layer 109', while the implementation may be also applied in case that the free layer 104' is formed over the pinned layer 109'. When the free layer 104' is formed over the pinned layer 109', the second protective layer 115 may be formed on sidewalls of or including the free layer 104' and apply a compressive stress to a part of the variable resistance element 100, for example, the free layer 104', while the first protective layer 108 may be formed on sidewalls of or including the pinned layer 109' and apply a tensile stress to a part of the variable resistance element 100, for example, the pinned layer 109'.

Hereinafter, a method for fabricating a semiconductor memory in accordance with an implementation of the present disclosure will be described.

FIGS. 3A to 3H are cross-sectional views illustrating an exemplary semiconductor memory and a method for fabricating the same in accordance with an implementation of the present disclosure. A detailed description for substantially the same parts as the above implementation of FIG. 2 is omitted.

Figure 3A:
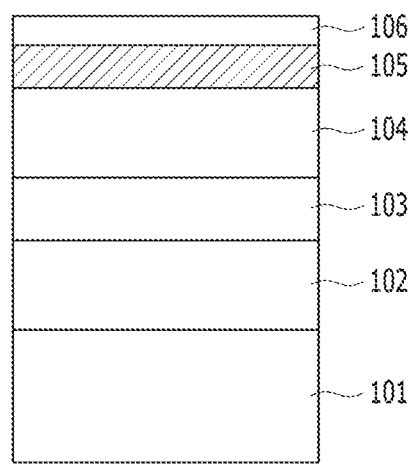
FIGS. 3A to 3H are cross-sectional views illustrating an exemplary semiconductor memory and a method for fabricating the same in accordance with an implementation of the disclosed technology.

Referring to FIG. 3A, a substrate 101 in which a predetermined structure (not shown) may be provided. The predetermined structure may include a switch or switching circuit/element, for example, a transistor or a diode, for controlling an access to a particular variable resistance element (see the reference numeral 100 of FIG. 3H), or a contact plug for coupling the variable resistance element 100 to the switch or switching circuit/element, or the like. The substrate 101 may be or include a semiconductor substrate.

Material layers 102 to 106 may be formed over the substrate 101 and form a first portion (a first stack structure) of the variable resistance element 100. In this implementation, the material layers 102 to 106 may include a material layer 102 for a buffer layer, a material layer 103 for an under layer, a material layer 104 for a free layer, a material layer 105 for a tunnel barrier layer and a material layer 106 for a first capping layer, which are sequentially stacked.

Figure 3B:
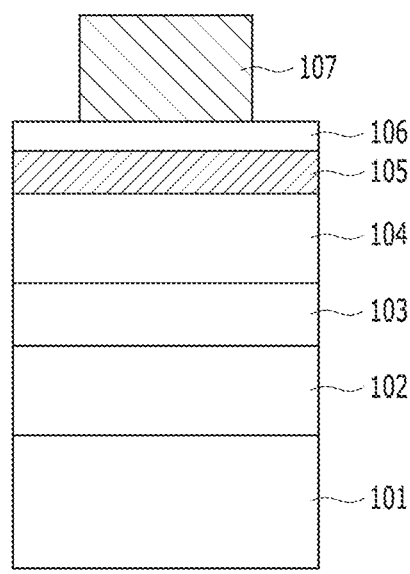

Referring to FIG. 3B, a first hard mask pattern 107 may be formed over the material layer 106 for the first capping layer.

The first hard mask pattern 107 may be formed by forming a material layer for the first hard mask pattern 107 and a photoresist pattern (not shown) over the material layer 106 for the first capping layer and etching the material layer for the first hard mask pattern 107 using the photoresist pattern as an etch barrier.

The material layer 106 for the first capping layer, the material layer 105 for the tunnel barrier layer, the material layer 104 for the free layer, the material layer 103 for the under layer and the material layer 102 for the buffer layer may be etched using the first hard mask pattern 107 as an etch barrier. The etch process may be performed by a suitable technique, for example, an ion beam etch (IBE) process or a reactive ion etch (RIE) process.

Figure 3C:
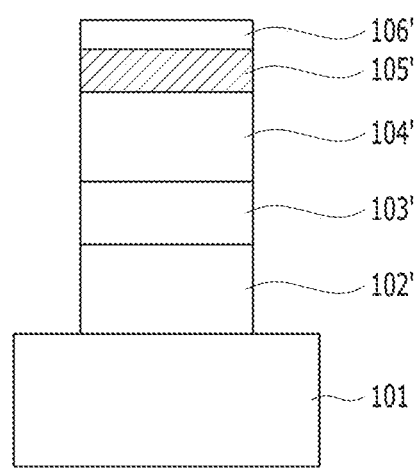

Referring to FIG. 3C, a first stack structure in which a buffer layer 102', an under layer 103', a free layer 104', a tunnel barrier layer 105' and a first capping layer 106' are sequentially stacked may be formed over the substrate 101. The first stack structure may correspond to a lower structure included in the variable resistance element 100.

The first hard mask pattern 107 may be removed during this etch process or by a separate removing process.

In the above implementation, the first capping layer 106' remains. Other implementations are also possible such that the first capping layer 106' is removed during this etch process or by a separate removing process.

Figure 3D:
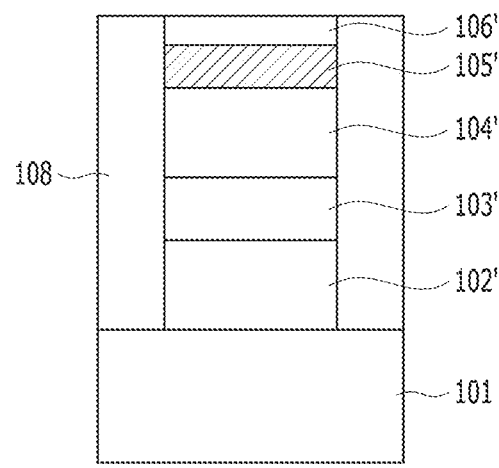

Referring to FIG. 3D, a first protective layer 108 may be formed on a sidewall of the first stack structure by performing a passivation process and a surface cleaning process to the first stack structure including the buffer layer 102', the under layer 103', the free layer 104', the tunnel barrier layer 105' and the first capping layer 106'.

The first protective layer 108 may be formed of or include a material capable of applying a compressive stress to at least a part of the variable resistance element 100, for example, the free layer 104'. The passivation process for forming the first protective layer 108 may be performed using an oxide, a nitride, or hydrogen, or a combination thereof.

Figure 3E:
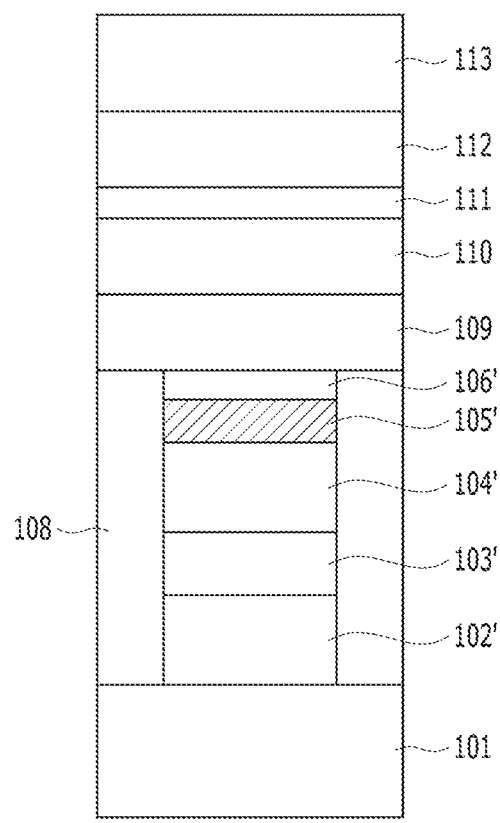

Referring to FIG. 3E, material layers 109 to 113 for forming a second portion (a second stack structure) may be formed over the first stack structure including the first capping layer 106' and the first protective layer 108. In this implementation, the material layers 109 to 113 may include a material layer 109 for a pinned layer, a material layer 110 for a pinning layer, a material layer 111 for a spacer layer, a material layer 112 for a magnetic correction layer and a material layer 113 for a second capping layer, which are sequentially stacked.

Figure 3F:
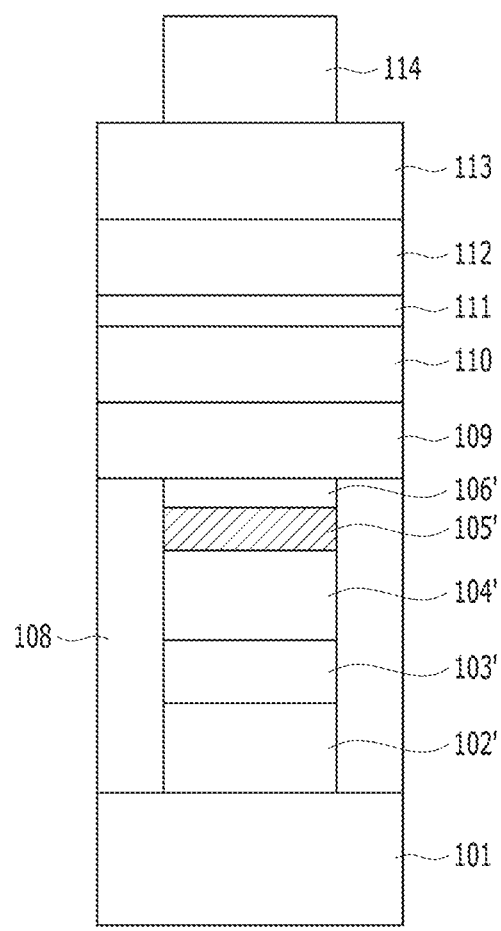

Referring to FIG. 3F, a second hard mask pattern 114 may be formed over the material layer 113 for the second capping layer. The second hard mask pattern 114 may be formed by using the same method as that for forming a first hard mask pattern 107.

The material layer 113 for the second capping layer, the material layer 112 for the magnetic correction layer, the material layer 111 for the spacer layer, the material layer 110 for the pinning layer and the material layer 109 for the pinned layer may be etched using the second hard mask pattern 114 as an etch barrier. The etch process may be performed by a suitable technique such as an ion beam etch (IBE) process or a reactive ion etch (RIE) process.

The second hard mask pattern 114 may be removed during this etch process or by a separate removing process.

In the above implementation, a second etch process is performed using the second hard mask pattern 114. In other implementations, instead of forming the second hard mask pattern 114, a second capping layer (see the reference numeral 113' of FIG. 3G) may be formed by patterning the material layer 113 for the second capping layer and then the second etch process may be performed using the second capping layer 113' as a hard mask.

Figure 3G:
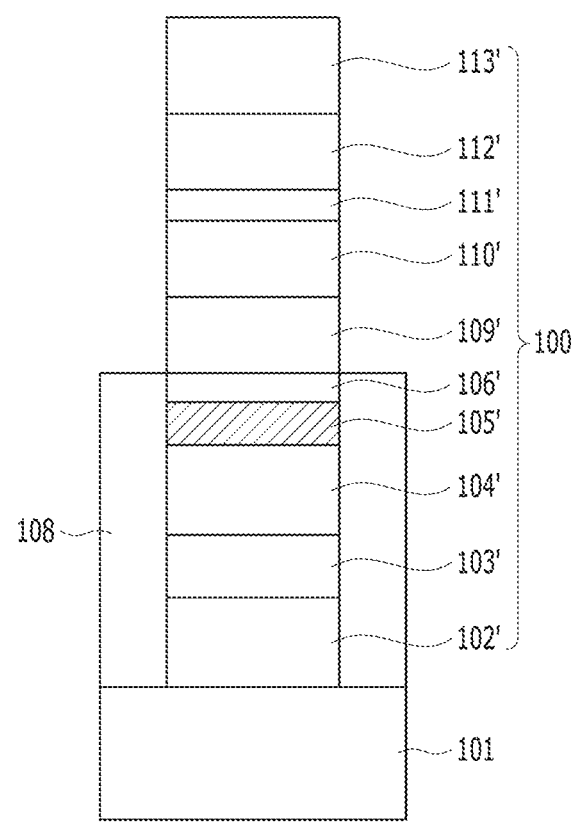

Referring to FIG. 3G, the second stack structure in which a pinned layer 109', a pinning layer 110', a spacer layer 111', a magnetic correction layer 112' and a second capping layer 113' are sequentially stacked may be formed over the first capping layer 106'. The second stack structure may correspond to an upper structure included in the variable resistance element 100.

Figure 3H:
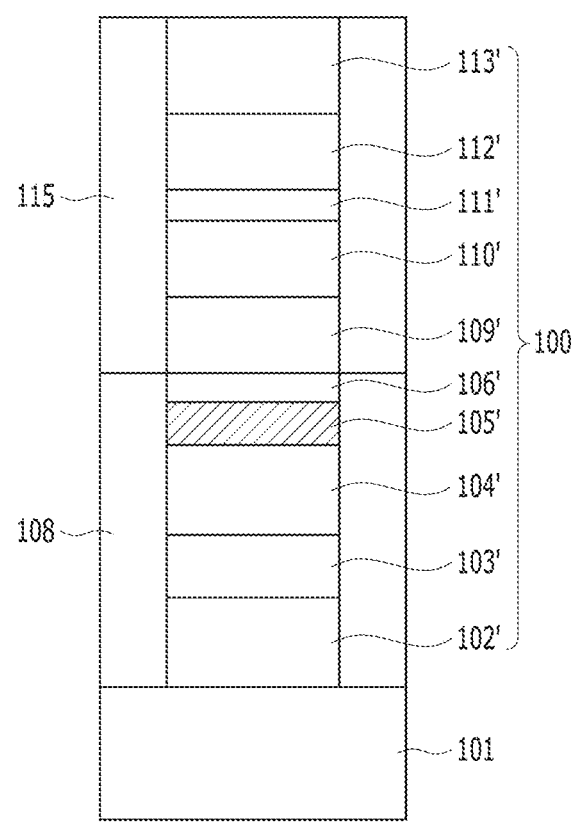

Referring to FIG. 3H, a second protective layer 115 may be formed on a side wall of the second stack structure by performing a passivation process and a surface cleaning process to the second stack structure including the pinned layer 109', the pinning layer 110', the spacer layer 111', the magnetic correction layer 112' and the second capping layer 113'.

The second protective layer 115 may be formed of or include a material capable of applying a tensile stress to at least a part of the variable resistance element 100, for example, the pinned layer 109' (or the pinned layer 109' and the pinning layer 110'). The passivation process for forming the second protective layer 115 may be performed using an oxide, a nitride, or hydrogen, or a combination thereof.

In the implementation, in patterning the variable resistance element 100, the etch process may be performed twice by two different steps. For example, the first etch process is performed for a lower portion and the second etch process is performed for an upper portion. As compared to the conventional variable resistance element provided by performing one etching process etching all layers at once, by performing two separate etching processes for forming the variable resistance element 100, the height to be etched at one time can be reduced and a difference in an etch rate depending on materials of the layers to be etched can be reduced. Therefore, it is possible to form a profile of the variable resistance element 100 closer to a vertical shape compared to the variable resistance element provided with only one etching process. As a result, a volume deformation of magnetic layers included in the variable resistance element 100 can be prevented so as to improve magnetic characteristics of the variable resistance element 100.

Also, since an etch time for performing each etch process can be reduced, it is possible to prevent deterioration of characteristics of the variable resistance element 100 due to redeposition of etch byproducts which occurs as the etch time is increased.

Further, by performing an individual passivation process to each of the first stack structure and the second stack structure of the variable resistance element 100, two different stresses can be applied to the upper portion and the lower portion of the variable resistance element 100, respectively. For example, the first protective layer 108 can apply a compressive stress to the free layer 104', and the second protective layer 115 can apply a tensile stress to the pinned layer 109' and the pinning layer 110'. Therefore, it is possible to affect a crystalline structure of the magnetic layers, in particular so as to reduce a lattice constant of the free layer 104', thereby improving characteristics of the variable resistance element 100.

The above and other memory circuits or semiconductor devices based on the disclosed technology can be used in a range of devices or systems. FIGS. 4 to 8 provide some examples of devices or systems that can implement the memory circuits disclosed herein.

Figure 4:
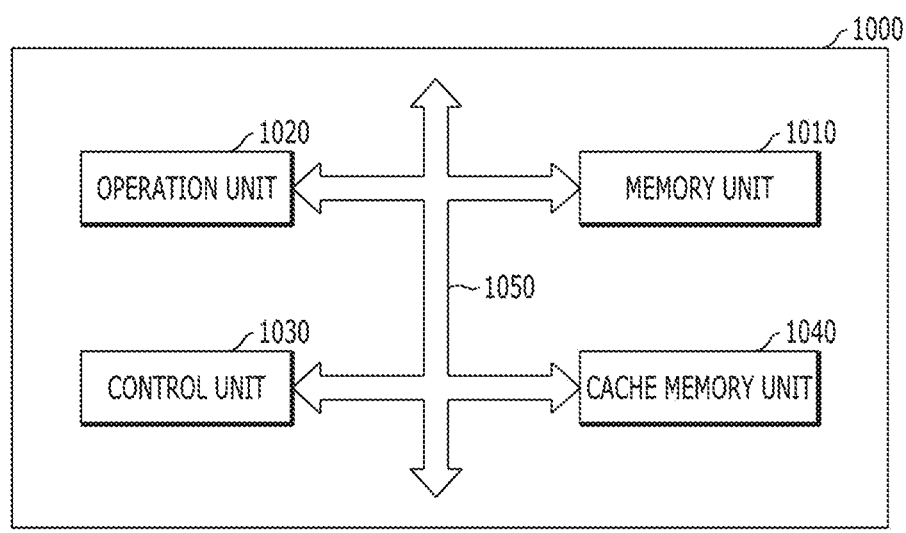
FIG. 4 is an example of configuration diagram of a microprocessor implementing memory circuitry based on an implementation of the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
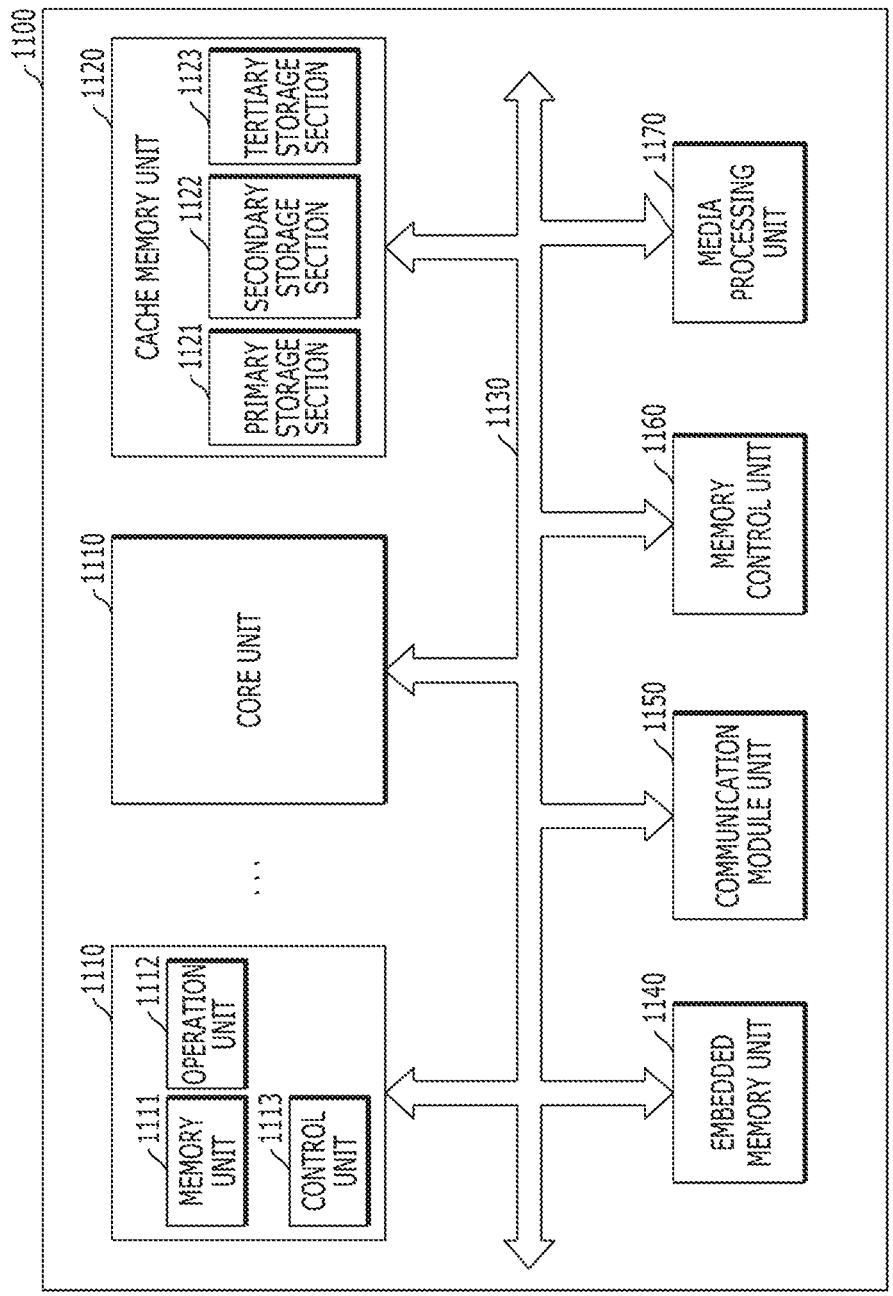
FIG. 5 is an example of configuration diagram of a processor implementing memory circuitry based on an implementation of the disclosed technology.

FIG. 5 is an example of configuration diagram of a processor implementing memory circuitry based on an implementation of the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the cache memory unit 1120 may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
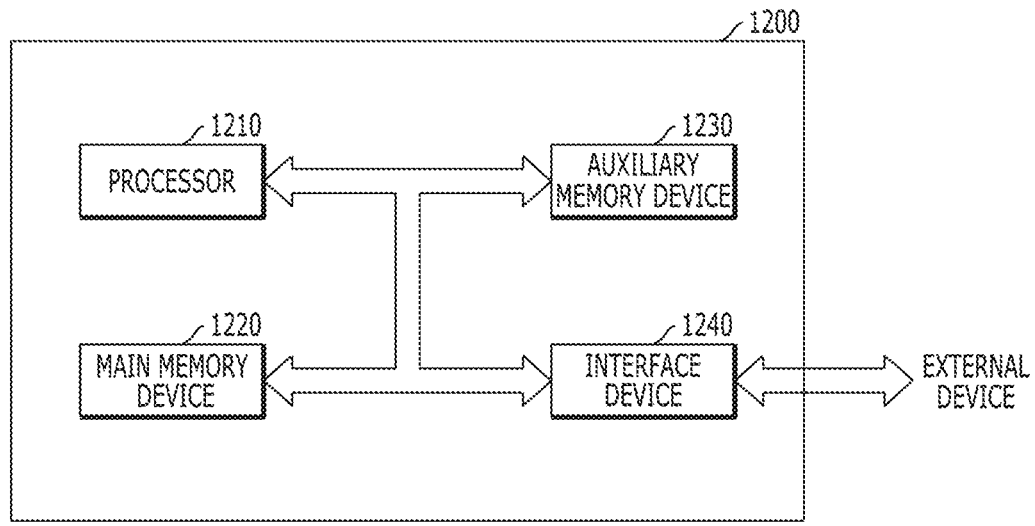
FIG. 6 is an example of configuration diagram of a system implementing memory circuitry based on an implementation of the disclosed technology.

FIG. 6 is an example of configuration diagram of a system implementing memory circuitry based on an implementation of the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc, for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband. CDMA (WCDMA), ultra wideband (UWB), such as various devices which send and receive data without transmit lines, and so on.

Figure 7:
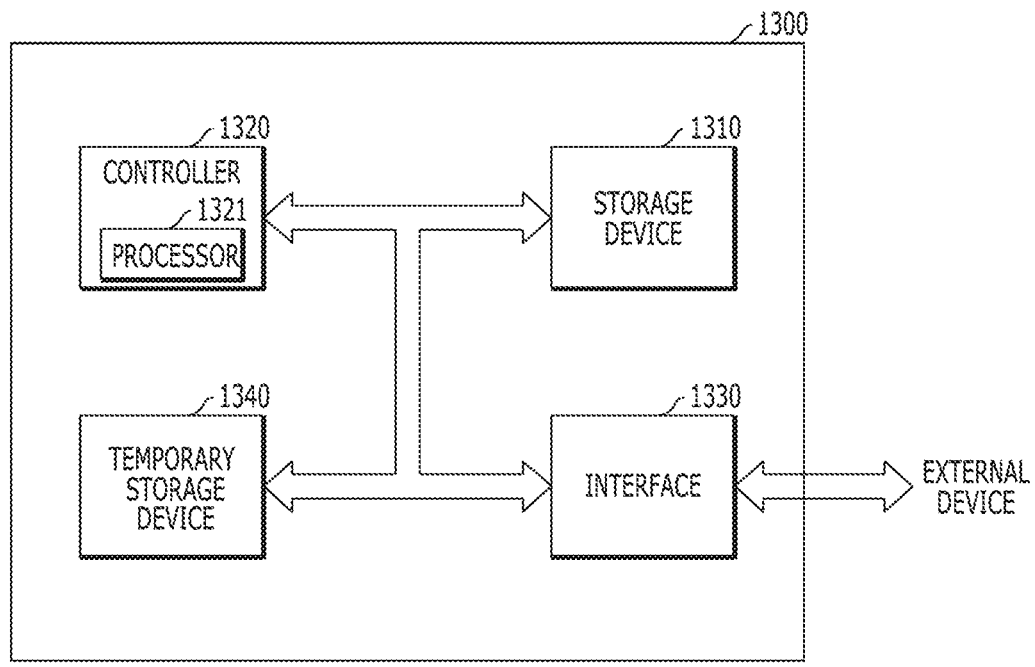
FIG. 7 is an example of configuration diagram of a data storage system implementing memory circuitry based on an implementation of the disclosed technology.

FIG. 7 is an example of configuration diagram of a data storage system implementing memory circuitry based on an implementation of the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SI)) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the storage device 1310 or the temporary storage device 1340 may be improved. As a consequence, operating characteristics and data storage characteristics of the data storage system 1300 may be improved.

Figure 8:
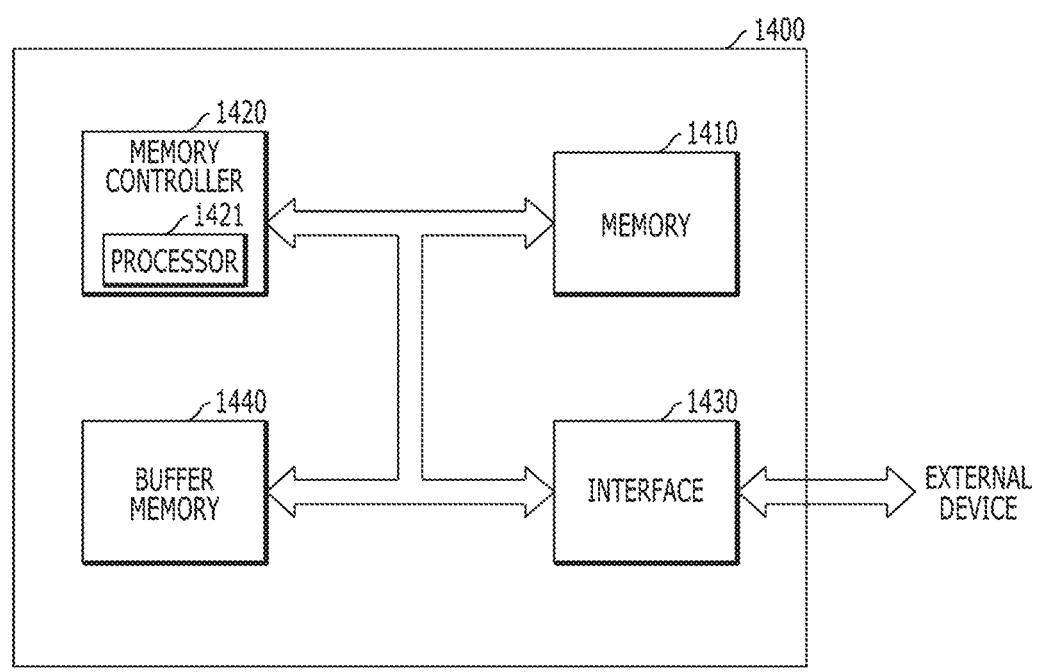
FIG. 8 is an example of configuration diagram of a memory system implementing memory circuitry based on an implementation of the disclosed technology.

FIG. 8 is an example of configuration diagram of a memory system implementing memory circuitry based on an implementation of the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include may include a variable resistance element including a Magnetic Tunnel Junction (MTJ) structure including a free layer having a variable magnetization direction, a pinned layer having a fixed magnetization direction and a tunnel barrier layer interposed between the free layer and the pinned layer; a first protective layer disposed on a lower sidewall of the variable resistance element; and a second protective layer disposed on an upper sidewall of the variable resistance element, wherein any one layer of the first protective layer and the second protective layer may apply a compressive stress to the variable resistance element, and the other layer applies a tensile stress to the variable resistance element. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device comprising:
   forming a first portion of a variable resistance element over a substrate, the first portion including a free layer having a variable magnetization direction and a tunnel barrier layer disposed over the free layer;
   forming a first protective layer on a sidewall of the free layer and a sidewall of the tunnel barrier layer by performing a first passivation process, the first protective layer arranged along a direction perpendicular to a surface of the free layer;
   forming a second portion of the variable resistance element over the first portion, the second portion including a pinned layer having a fixed magnetization direction; and
   forming a second protective layer on a sidewall of the pinned layer by performing a second passivation process, the second protective layer arranged along the direction,
   wherein any one layer of the first protective layer and the second protective layer applies a compressive stress to the variable resistance element, and the other layer applies a tensile stress to the variable resistance element,
   wherein each of the first protective layer and the second protective layer includes a passivation layer including an oxide, or hydrogen, or a combination of the oxide and the hydrogen.

2. The method of claim 1, wherein the first protective layer applies a compressive stress to at least a part of the variable resistance element.

3. The method of claim 1, wherein the first protective layer applies a compressive stress to the free layer.

4. The method of claim 1, wherein the second protective layer applies a tensile stress to at least a part of the variable resistance element.

5. The method of claim 1, wherein the second protective layer applies a tensile stress to the pinned layer.

6. The method of claim 1, wherein each of the first passivation process and the second passivation process is performed by using a material capable of applying any one of a compressive stress and a tensile stress to at least a part of the variable resistance element.

7. The method of claim 6, wherein the material includes an oxide, a nitride, or hydrogen, or a combination thereof.

8. The method of claim 1, wherein the first portion and the second portion have sidewalls aligned with each other.

9. The method of claim 1, wherein the first portion of the variable resistance element further includes:
   a tunnel barrier layer formed over the free layer; and
   a first capping layer formed over the tunnel barrier layer,
   wherein the second portion of the variable resistance element further includes:
   a pinning layer formed over the pinned layer,
   wherein the first protective layer applies a compressive stress to the free layer, and the second protective layer applies to a tensile stress to the pinned layer and the pinning layer.

10. The method of claim 9, wherein the variable resistance element is configured to represent different resistance values depending on magnetization directions of the free layer and the pinned layer.

11. The method of claim 9, wherein the variable resistance element further includes an under layer disposed under the free layer and configured to improve magnetic characteristics of the free layer.

12. The method of claim 9, wherein the pinning layer includes an antiferromagnetic material.

13. The method of claim 9, wherein the variable resistance element further includes a magnetic correction layer located above the pinned layer and configured to fix a magnetization direction of the pinned layer.

14. The method of claim 1, wherein the first protective layer and the second protective layer are structure to cover an entire sidewall of the variable resistance element.

15. The method of claim 1, wherein at least one of the first protective layer and the second protective layer includes an oxide layer, a nitride layer, or a hydrogen layer, or a combination.

* * * * *